(12) United States Patent
Kendall et al.

(10) Patent No.: US 7,544,951 B2
(45) Date of Patent: Jun. 9, 2009

(54) ELECTRON GUN ASSEMBLY

(75) Inventors: Rodney Kendall, Ridgefield, CT (US); Tomohiko Abe, Tokyo (JP)

(73) Assignee: NuFlare Technology, Inc., Shizuaka-ken (JP)

(*) Notice: Subject to any disclaimer, the term of this patent is extended or adjusted under 35 U.S.C. 154(b) by 459 days.

(21) Appl. No.: 11/495,628

(22) Filed: Jul. 31, 2006

(65) Prior Publication Data
US 2008/0023642 A1 Jan. 31, 2008

(51) Int. Cl.
G21K 1/08 (2006.01)
H01J 3/14 (2006.01)
H01J 3/26 (2006.01)
H01J 49/42 (2006.01)

(52) U.S. Cl. .......... 250/396 R; 250/310; 250/311; 250/492.1; 250/492.2; 250/492.22; 250/492.3; 313/310; 313/341; 313/343; 313/336; 313/413; 313/414; 313/442; 313/433; 313/443; 315/106; 315/107; 315/383; 315/360; 315/307

(58) Field of Classification Search .......... 250/396 R, 250/310, 311, 492.1, 492.2, 492.22, 492.3; 313/310, 341, 343, 336, 413, 414, 442, 433, 313/443; 315/107, 106, 383, 360, 307
See application file for complete search history.

(56) References Cited

U.S. PATENT DOCUMENTS

| | | |
|---|---|---|
| 5,578,821 A | 11/1996 | Meisberger et al. |
| 7,449,700 B2 * | 11/2008 | Inanami .......... 250/492.22 |
| 2003/0160192 A1 | 8/2003 | Inanami et al. |
| 2005/0109955 A1 | 5/2005 | Nagano et al. |

OTHER PUBLICATIONS

Reinhold, "Pressurized 1-MeV Electron Accelerator of the Twin-Tank Design for Electron Microscopy," IEEE (1969), pp. 119-123.
BOC Edwards, Temescal, Model STIH-270-02CK SuperSource2™, Convertible Electron Beam Turret Source. http://www.bocedwards.com/coating_system/temescal/supersource 2_guns.cfm, Temescal® Coating Products—Components.Electron Beam Guns & Power Supply Packages-Multi-Pocket Guns; May 10, 2006.
Meisburger et al., "Requirements and Performance of an Electron-Beam Column Designed for X-Ray Mask Inspection", J. Vac. Sci. Technol. B 9 (6), pp. 3010-3014, (1991).

* cited by examiner

Primary Examiner—Jack I Berman
Assistant Examiner—Meenakshi S Sahu
(74) Attorney, Agent, or Firm—Finnegan, Henderson, Farabow, Garrett & Dunner, L.L.P.

(57) ABSTRACT

A device which employs an electron beam, for performing a desired function, includes an electron gun for generating the electron beam. The electron gun includes a barrel shaped rotatable structure having a plurality of annularly disposed electron sources. A curvature of a surface portion of the rotatable structure is shaped to optimize electric field concentrations. The rotatable structure further includes end portion protrusions.

29 Claims, 5 Drawing Sheets

ELECTRON GUN ASSEMBLY

DESCRIPTION OF THE EMBODIMENTS

1. Field of the Invention

The present invention relates to an apparatus for generating a charged particle beam and, more particularly, to an electron gun assembly for use in devices that utilize an electron beam.

2. Background of the Invention

A wide variety of devices employ a charged particle beam, such as an electron beam, for performing a desired function. Examples of such devices include electron beam lithography systems, scanning electron microscopes, transmission electron microscopes, mass spectrometers, microwave tubes, and particle accelerators. Each such device requires an electron source including a cathode to serve as a source of electrons for the electron beam. One type of electron source is a thermionic source in which material is heated to a temperature at which electrons are emitted. Another type of electron source is a field emission source in which a very high electric field is applied to a sharp tip of an emitter in order to extract electrons.

The electron source with its associated electrodes, electrical connections, and vacuum housing is commonly referred to as an electron gun. One difficulty encountered with electron guns is the limited life of the electron source and a corresponding need to replace it. The need to replace the electron source disrupts the availability of the device, and replacement can entail a significant amount of time. For example, since such devices contain precisely aligned components, such alignment needs to be reestablished after replacing the electron source. Further, the portion of such devices within which the electron beam is generated and transmitted is typically contained within a vacuum vessel in order to maintain vacuum during operation. As a result, replacement of the electron source also requires disassembling and reassembling the vacuum vessel and recalibrating the system.

One solution that has been proposed for overcoming the problems arising from the limited life of the electron source is to provide multiple electron sources mounted in a rotatable structure. Then, upon failure of a currently operating electron source, the structure can be rotated to move a new electron source into position for continued operation without required realignment or the need to open the vacuum vessel. While the use of the rotatable structure reduces the problems associated with failure of electron sources, such a structure may encounter problems resulting from, among other things, failures due to high electric field concentrations required to generate the electrons and surface charging effects caused by reflected and scattered electrons and ions resulting from the scattered electrons.

As a result, there still exists a need for a solution to the above described problems associated with electron source failure.

SUMMARY OF THE INVENTION

Consistent with embodiments of the present invention, there is provided a rotatable structure for use in an electron beam system, comprising: a first portion having a generally circular cross section about a first rotation axis and including a first mating end and a first outer end at opposite ends of the first portion; a second portion having a generally circular cross section about a second rotation axis and including a second mating end and second outer end at opposite ends of the second portion; each of the first and second outer ends including an annular protrusion; the first and second mating ends having substantially the same inside diameter and substantially the same outside diameter and including depressions evenly spaced therealong; wherein upon joining the first and second mating ends such that the first and second rotation axes align, and corresponding ones of the depressions in the first and second mating ends align, the aligned depressions define openings each adapted to receive an electron source.

Also consistent with embodiments of the present invention, there is provided a rotatable structure for use in an electron beam system, comprising: a generally barrel shaped central portion having a generally annular cross section concentric about a rotation axis, an outer surface of the central portion having a first curvature in a plane perpendicular to the rotation axis, a center of curvature of the first curvature being on the rotation axis, a diameter of the outer surface being greatest at a midpoint along a direction generally parallel to the rotation axis and decreasing toward opposite ends of the central portion, a second curvature of the outer surface along the direction generally parallel to the rotation axis having a center of curvature displaced from the rotation axis; and a plurality of openings annularly disposed in the central portion along a circumference at the midpoint of the central portion, each of the openings being adapted to receive an electron source.

Further consistent with embodiments of the present invention, there is provided a rotatable structure for use in an electron beam system, comprising: a generally barrel shaped central portion having a generally annular cross section concentric about a rotation axis; and first and second end portions respectively on opposite ends of the central portion, each of the first and second end portions having a generally annular cross section concentric with the central portion and including a protrusion having an outside diameter greater than a diameter of the central portion at a plane where the first or second end portion meets the central portion; wherein the central portion includes a plurality of openings annularly disposed along a circumference at a midpoint of the central portion, each of the openings being adapted to receive an electron source.

Additionally consistent with embodiments of the present invention, there is provided an electron beam system, comprising: an electron gun for generating an electron beam; beam optics to receive the generated electron beam and to perform beam shaping and steering functions; and a controller coupled at least to the beam optics to control the beam shaping and steering functions; wherein the electron gun comprises a rotatable structure including a generally barrel shaped central portion having a generally annular cross section concentric about a rotation axis, an outer surface of the central portion having a first curvature in a plane perpendicular to the rotation axis, a center of curvature of the first curvature being on the rotation axis, a diameter of the outer surface being greatest at a midpoint along a direction generally parallel to the rotation axis and decreasing toward opposite ends of the central portion, a second curvature of the outer surface along the direction generally parallel to the rotation axis having a center of curvature displaced from the rotation axis, and a plurality of openings annularly disposed in the central portion along a circumference at the midpoint of the central portion, each of the openings being adapted to receive an electron source.

Also consistent with embodiments of the present invention, there is provided an electron beam system, comprising: an electron gun for generating an electron beam; beam optics to receive the generated electron beam and to perform beam shaping and steering functions; and a controller coupled at least to the beam optics to control the beam shaping and steering functions; wherein the electron gun comprises a rotatable structure including a generally barrel shaped central portion having a generally annular cross section concentric about a rotation axis, and first and second end portions respectively on opposite ends of the central portion, each of the first and second end portions having a generally annular cross section concentric with the central portion and including a protrusion having an outside diameter greater than a diameter of the central portion at a plane where the first or second end portion meets the central portion, wherein the central portion includes a plurality of openings annularly disposed along a circumference at a midpoint of the central portion, each of the openings being adapted to receive an electron source.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Figure 1:
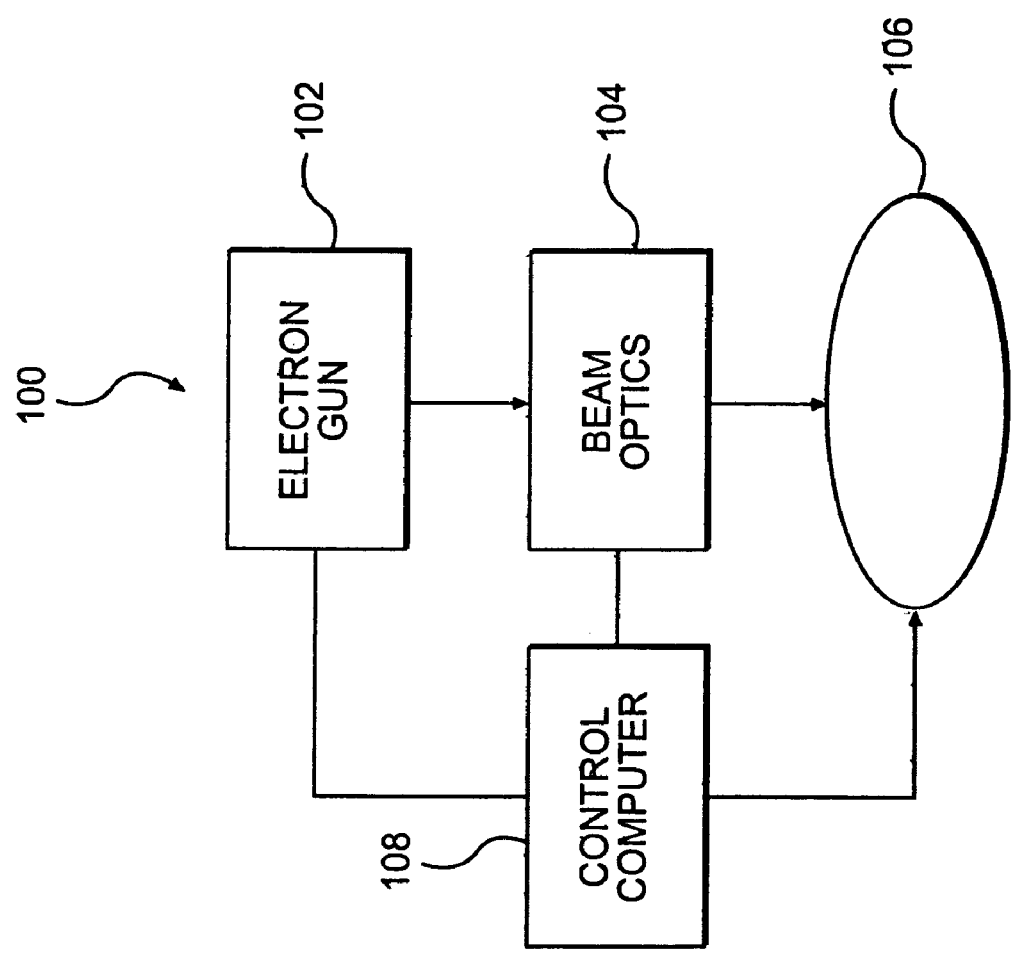
FIG. 1 illustrates an exemplary device which employs an electron beam.

FIG. 1 illustrates an exemplary electron beam device 100 which employs an electron beam perform a desired function. The device 100 includes an electron gun comprising an electron gun 102 which includes an electron source that produces a beam of electrons that are accelerated and focused by beam optics 104 into a desired shape for projection onto a desired location on a workpiece. In the exemplary device 100 shown in FIG. 1, the beam is directed onto a semiconductor wafer 106 undergoing processing or inspection, such as in an electron beam lithography system or wafer inspection system. Depending on the particular beam device application, the beam optics 104 can be configured to perform a wide variety of functions including shaping, collimating, aligning, accelerating, and scanning the electron beam. For example, the beam optics 104 of the device 100 may include various lenses to focus, magnify or demagnify, and project the electron beam, a beam blanker to turn the beam on and off, various apertures to steer and shape the beam, and a beam deflection system to position the beam on the wafer 106. A control computer 108 may be implemented to control operation of the entire device 100. However, embodiments consistent with the present invention are not limited to any particular configuration of beam optics or particular function of the electron beam device in which the invention may be practiced.

Electron beam devices in which the present invention may be practiced include electron beam lithography systems. Exemplary electron beam lithography systems are described in U.S. Patent Application Publication No. 2005/0109955, published May 26, 2005, entitled "CHARGED PARTICLE BEAM LITHOGRAPHY SYSTEM, PATTERN DRAWING METHOD, AND METHOD OF MANUFACTURING SEMICONDUCTOR DEVICE," and U.S. Patent Application Publication No. 2003/0160192, published Aug. 28, 2003, entitled "CHARGED PARTICLE BEAM EXPOSURE METHOD AND METHOD FOR PRODUCING CHARGED PARTICLE BEAM EXPOSURE DATA," the entire disclosures of which are incorporated herein by reference.

Figure 2:
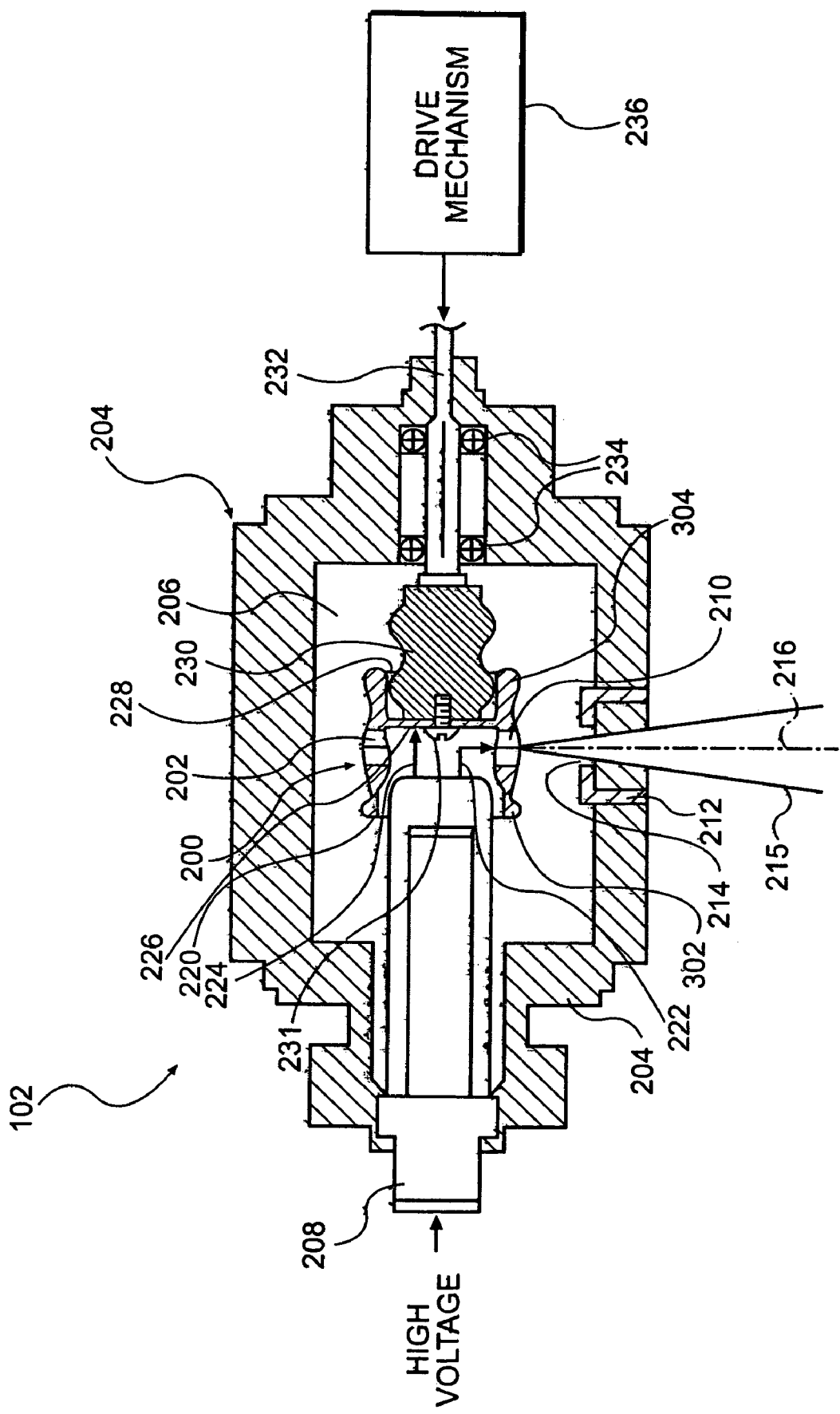
FIG. 2 shows a sectional view of an exemplary structure of an electron source.

FIG. 2 illustrates a sectional view of an exemplary structure of electron gun 102 consistent with an embodiment of the present invention. Electron gun 102 includes a rotatable barrel assembly 200 which, in turn, includes a plurality of annularly disposed electron sources 202. Each electron source 202 includes a cathode that serves as the source of electrons. The electron gun 102 includes a vacuum vessel 204 which defines a chamber 206 within which the rotatable barrel assembly 200 is mounted. Rotatable barrel assembly 200 is mounted within chamber 206 to enable its operation in vacuum. The vacuum vessel 204 may be integral with or connectable to other components of the electron beam device 100, including the beam optics 104, in a manner suitable to maintain the integrity of the vacuum vessel 204, while permitting a generated electron beam to be transmitted into the beam optics 104.

A high voltage feedthrough 208 is introduced through a wall of the vacuum vessel 204 to provide high voltage and current to an active one of the annularly disposed electron sources 202, designated source 210, and to apply high voltage to the barrel assembly 200. The active source 210 is positioned above an anode 212 having an aperture 214 through which an electron beam 215 having a beam radiation axis 216 passes. The anode 212 may be grounded or held at a desired potential, as may be required for the particular application of the electron beam device 100. The annularly disposed sources 202 are spaced at equidistant intervals selected to be large enough to prevent contamination from reflected and scattered electrons or evaporated material from the active source 210 and small enough to maximize the number of electron sources. As a result, the unused sources 202 adjacent to the active sources 210 can be protected from contamination during generation of the electron beam by the active source 210, while the number of electron sources 202 is maximized.

The high voltage feedthrough 208 is introduced through a first end portion 220 of the barrel assembly 200. The high voltage feedthrough 208 carries a number of electrical conductors as may be required for the particular application. For example, and without limitation, the high voltage feedthrough 208 may carry three conductors, two of which are for connection to the active source 210 to conduct a current therethrough and a third conductor for connection to the barrel assembly 200 to maintain the barrel assembly 200 at a high voltage. Such exemplary connections are diagrammatically shown in FIG. 2 by electrical contacts 222 contacting the active source 210 and an additional electrical contact 224 contacting an internal wall 226 of the barrel assembly 200. In accordance with such exemplary connections, each of the electron sources 202 may include two electrical contacts for connecting to the contacts 222 upon becoming the active source 210. The electrical contacts 222 may be leaf-spring type contacts to make a wiping contact with the contacts on the active source 210, to enable the rotation of the barrel assembly 200, as more fully explained below. Similarly, the contact 224 may also be a leaf-spring type contact to make a wiping contact with the internal wall 226 of the barrel assembly 200.

An electrical insulator 230 is fixedly attached to the internal wall 226 by means such as a bolt 231. The insulator 230 may be fabricated from any material suitable for the operating conditions of the particular application. For example and without limitation, insulator 230 may be provided as a ceramic insulator. The insulator 230 is, in turn, fixedly attached to a rotation shaft 232. The rotation shaft 232 is mounted on ball bearing assemblies 234 which facilitate rotation of the shaft 232. As a result, the barrel assembly 200, the insulator 230, and the rotation shaft 232 all rotate as one rigid body. A drive mechanism 236, for example a stepper motor, is coupled to drive the rotation shaft 232 which, in turn, rotates the barrel assembly 200. The drive mechanism 236 can be controlled by the control computer 108, shown in FIG. 1. Alternatively, rotation shaft 232 can be rotated manually from outside the vacuum vessel 204.

Figure 3:
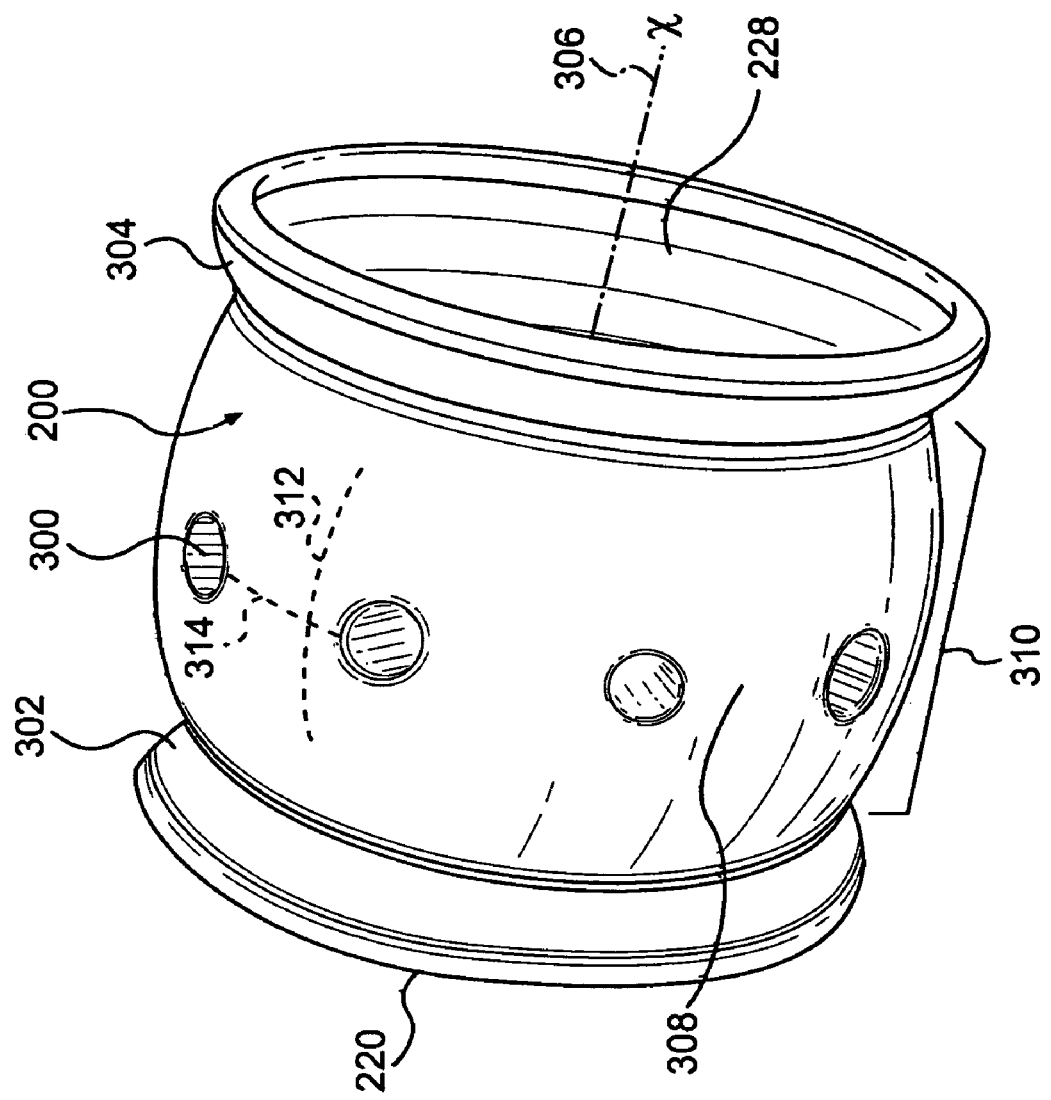
FIG. 3 shows a perspective view of a barrel assembly.

FIG. 3 shows a perspective view of the barrel assembly 200. The barrel assembly 200 includes a plurality of equidistantly spaced, annularly disposed openings 300 for receiving electron sources 202. The first end portion 220 includes an opening, circular in cross section, which receives the high voltage feedthrough 208, shown in FIG. 2. The second end portion 228 includes an opening, circular in cross section, which receives the insulator 230, also shown in FIG. 2. The first end portion 220 and the second end portion 228 respectively include protrusions 302 and 304 formed to be concentric about a rotation axis 306 of the barrel assembly 200. The first end portion 220 and the second end portion 228, and their respective protrusions 302 and 304, have a generally annular cross section concentric about the rotation axis 306.

An outer surface 308 of a central portion 310 of the barrel assembly 200 has a curvature along directions both generally parallel and generally perpendicular to the rotation axis 306. The central portion 310 is generally barrel shaped, annular in cross section, and concentric about the rotation axis 306. An outside diameter of the central portion, in a plane perpendicular to the rotation axis 306, is greater at a midpoint along a direction generally parallel to the rotation axis. The shape of the outer surface 308 is symmetrical about either side of the midpoint. The entire barrel assembly 200 is rotatable about the rotation axis 306.

The curvature generally parallel to the rotation axis 306 is represented by a broken line 312 in FIG. 3, while the curvature generally perpendicular to the rotation axis 306 is represented by a broken line 314 in FIG. 3. As more fully explained below, the center and radius of curvature of line 312 is different from the center and radius of curvature of line 314.

Figure 4A:
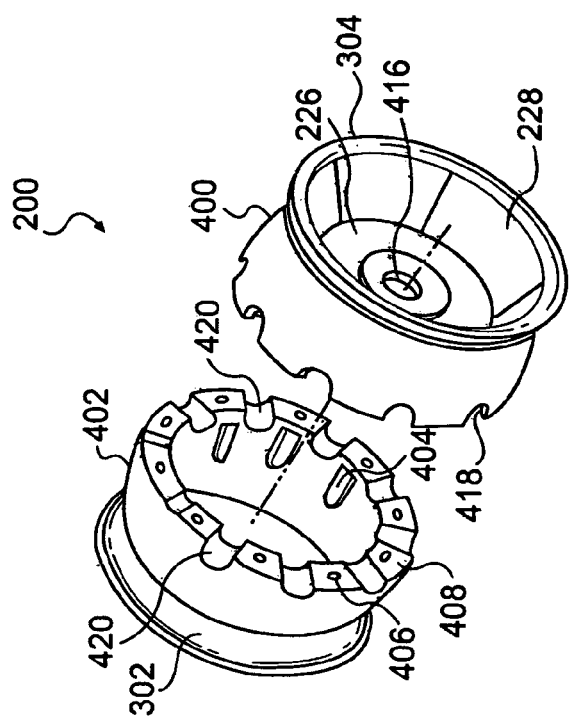
FIGS. 4A-4C illustrate a perspective view of the barrel assembly prior to and after assembly.
Figure 4B:
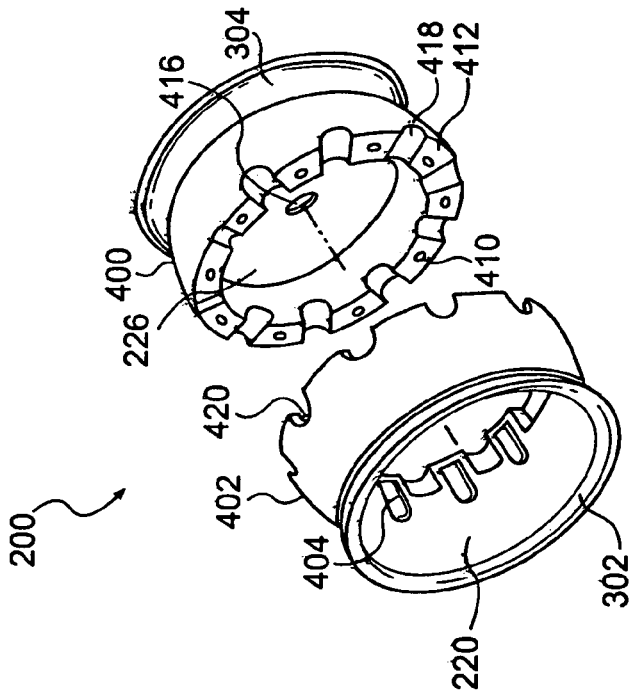
Figure 4C:
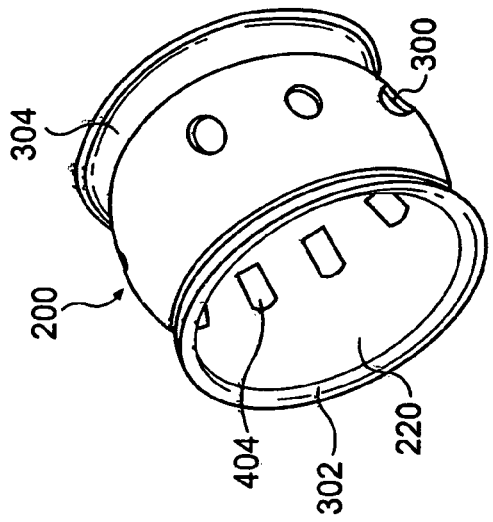

FIGS. 4A-4C illustrate a perspective view of the barrel assembly 200 prior to and after assembly. The barrel assembly 200 is formed by joining together a hub portion 400 and a rim portion 402 with the protrusions 304 and 302 respectively formed on the end portions thereof. The hub portion 400 and the rim portion 402 may, for example, and without limitation, be constructed from a stainless steel alloy or any metal having suitable structural properties. Each of the hub portion 400 and the rim portion 402 is generally circular in cross section about the intended rotation axis 306.

The hub portion 400 and the rim portion 402 are joined together using fasteners such as, for example, socket head cap type screws (not shown). As shown in FIGS. 4A and 4B, screws can be first inserted through insertion wells 404 into holes 406. Each hole 406 communicates between its corresponding insertion well 404 and a planar mating surface 408 of the rim portion 402. Each of the screws passed through its corresponding hole 406 is adapted for fastening engagement with a hole 410 in a planar mating surface 412 of the hub portion 400 (FIG. 4B).

The hub portion 400 further includes the internal wall 226, which is disk shaped, generally perpendicular to the rotation axis 306, and has a hole 416 in the center thereof. The hole 416 is centered about the rotation axis 306 of the barrel assembly 200. The hole 416 is adapted to receive therethrough a fastener, such as the bolt 231, for fixedly attaching the insulator 230, as shown in FIG. 2, to the end portion 228 of the hub portion 400.

The hub portion 400 includes depressions 418 evenly spaced between the planar mating surfaces 412. Similarly, the rim portion 402 includes evenly spaced depressions 420 between the planar mating surfaces 408, with the same spacing as for depressions 418.

Prior to joining together the hub portion 400 and the rim portion 402, each is electropolished to achieve a desired smoothness. Such smoothness improves vacuum performance by minimizing surface area and ensures there are no protrusions that could otherwise become electron sources when the barrel assembly 200 is maintained at high voltage during operation.

The hub portion 400 and the rim portion 402 are assembled together by aligning holes 406 and 410 and, thereby, aligning the corresponding planar mating surfaces 408 and 412, and passing screws through the holes 406 for engagement in the holes 410. As a result of joining together the hub portion 400 and the rim portion 402, as shown in FIG. 4C, the depressions 418 and 420 align to form the openings 300 for receiving the electron sources 202. Thus, the shapes of the depressions 418 and 420 are determined by the shape of the electron sources 202 that will be inserted into the openings 300. For example, if the electron sources 202 are cylindrical and have a circular cross section, then each of the depressions 418 and 420 will have a semicircular cross section. The electron sources 202 may be inserted into the openings 300 after hub portion 400 and the rim portion 402 are engaged but before the screws engaging holes 410 are tightened. Alternatively, the electron sources 202 can be pressed into the openings 300 after tightening the screws.

At their respective ends where the hub portion 400 and the rim portion 402 are joined together, each have substantially the same inside diameter and substantially the same outside diameter. Subsequent to joining the hub portion 400 and the rim portion 402, the outer surface 308 of the barrel assembly 200 is machined and polished to ensure a smooth contoured surface.

Figure 5:
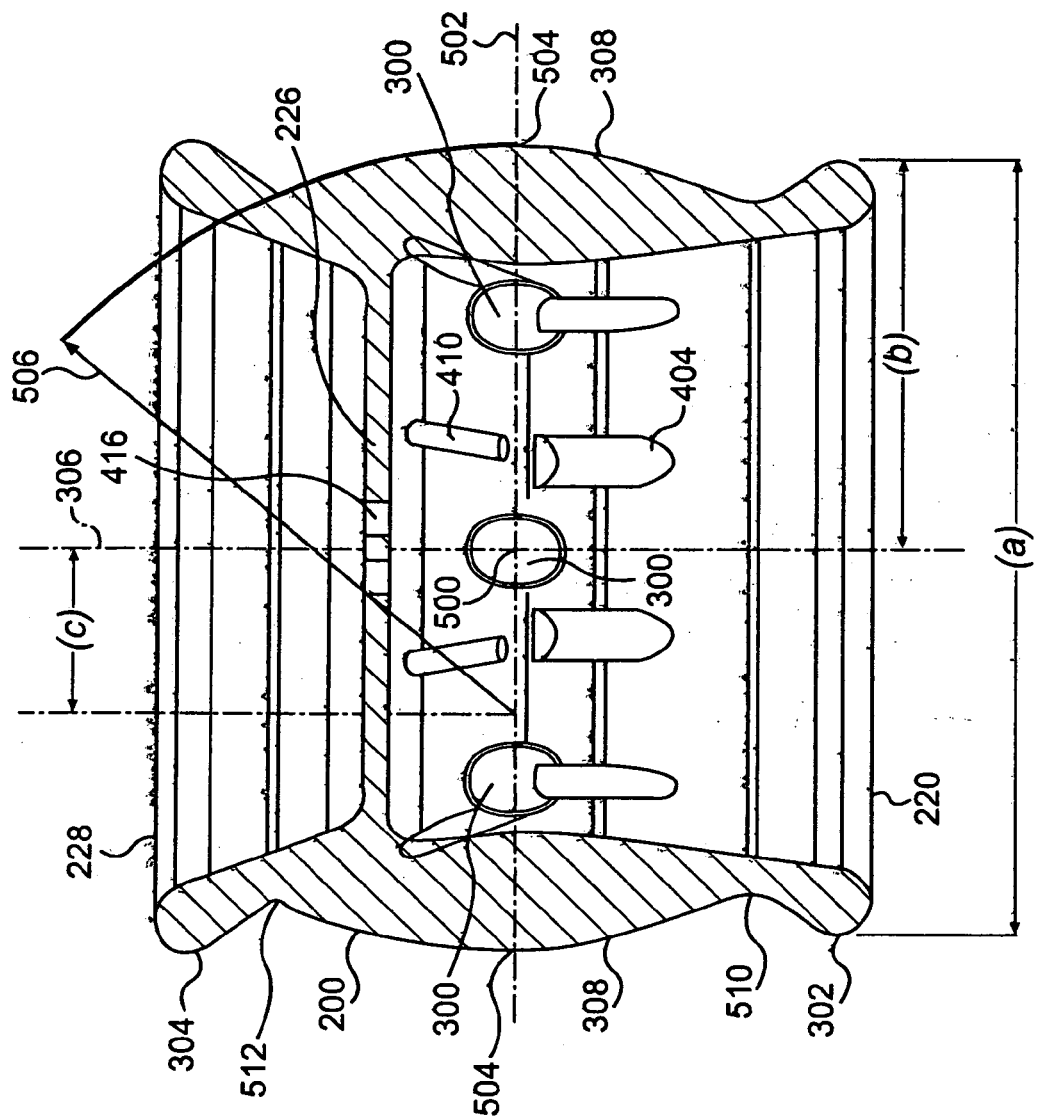
FIG. 5 illustrates a simplified sectional view of the barrel assembly.

FIG. 5 is a simplified sectional view of the barrel assembly 200, which illustrates dimensions of the barrel structure. Various features of the barrel assembly 200 are omitted from FIG. 5 in order to ensure clarity in illustrating the various dimensional features discussed hereafter. Thus, only exemplary ones of the wells 404, the openings 300, and the holes 410 are shown in FIG. 5. With reference to FIG. 5, the barrel assembly 200 has a diameter (a) and a rotation radius (b). The rotation radius (b) is the radius of curvature of the outer surface 308 represented by the broken line 314 in FIG. 3 and generally perpendicular to the axis of rotation 306. The center of curvature of the rotation radius (b) is a geometric center 500 of the barrel assembly 200 at the intersection of the rotation axis 306 and any axis, e.g., an axis 502, passing along a widest diameter of the central portion 310. The axis 502 intersects the outer surface 308 at a midpoint 504 along the direction generally parallel to the rotation axis 306. The diameter of the outer surface 308 is widest at the midpoint 504, which is the diameter (a), and its curvature along the broken line 312 (FIG. 3) is symmetrical to either side of the midpoint 504. As shown in FIG. 5, the distance across either the first end portion 220 or the second end portion 228, at the widest point, is also equal to the diameter (a).

A radius of curvature 506 of the curvature of the outer surface 308 represented by the broken line 312 and generally parallel to the rotation axis 306, has a center of curvature displaced by a length (c) from the geometric center 500, i.e., from the center of curvature on the rotation axis 306. As a result, the radius of curvature of the curvature of surface 308 generally parallel to the direction of the rotation axis 306 is the sum of rotation radius (b) and length (c). One purpose of this displacement by the length (c) is to optimize the high electric field concentrations between the surface of the barrel assembly 200 and the anode aperture 214. More particularly, such electric field concentrations would be optimized if the surface of the central portion 310 of the barrel assembly 200 was spherical. However, providing a spherical surface would result in physical transitions 510 and 512, where the central portion 310 joins the protrusions 302 and 304, respectively, being relatively sharp. Such sharp transitions could result in undesirably high electric field concentrations. The radius of curvature 506 along the broken line 312 is provided to be greater than along the broken line 314 in order to reduce the sharpness of the transitions 510 and 512 to an extent that results in acceptable field concentrations. At the same time, the greater radius of curvature 506 results in the central portion 310 not being precisely spherical. However, the resulting surface contour only slightly degrades the electric field uniformity between the surface of the barrel assembly 200 and the anode aperture 214 to a level that is acceptable.

For example and without limitation, exemplary values for diameter (a), radius (b), and length (c), are 75 cm, 37.5 cm, and 12.5 cm, respectively. An exemplary barrel assembly 200 provided with such dimensions would include ten openings 300 to receive the electron sources 202.

In the operation of electron beam device 100, vacuum is maintained within the chamber 206 of electron gun 102, as required for generation of electrons by the active source 210. High voltage and current are provided by the high voltage feedthrough 208 to the active source 210 by way of the electrical contacts 222, and high voltage is applied to the barrel assembly 200 by the electrical contact 224. As a result, the beam of electrons 215 directed toward the anode 212 and through the anode aperture 214 is generated.

When the active source 210 fails or it is otherwise desired to replace it, the drive mechanism 236 is operated, e.g., by the control computer 108, to rotate the barrel assembly 200 to bring a next one of the electron sources 202 into an aligned position with respect to the anode 212. Operation can then resume by providing high voltage and current to the new active source 210 by contact with the electrical contacts 222 and high voltage to the barrel assembly by the electrical contact 224. Since the electrical contacts 222 and 224 make a wiping engagement with the active source 210 and the internal wall 226, the barrel assembly 200 can be freely rotated to bring the next active source 210 into wiping engagement with the electrical contacts 222.

For example, and without limitation, during operation the high voltage feedthrough may apply a voltage of about 50,000 volts to the active source 210 and about 51,000 volts to the barrel assembly 200.

During generation of the electrons, electrons may be scattered from the region of the anode 212 and be directed toward the insulator 230. However, the protrusion 304, of the barrel assembly 200, partially shields the insulator 230 from the reflected electrons. As a result, the shielding prevents the accumulation of excessive charge on the surface of the insulator 230. Such excessive charge, if permitted to accumulate, could otherwise result in a discharge across the surface of the insulator 230, which could disrupt operation of the electron gun 102. Similarly, the protrusion 302 shields the high voltage feedthrough 208 from scattered electrons which may otherwise accumulate as excess charge on the surface thereof.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A rotatable structure for use in an electron beam system, comprising:
    a first portion having a generally circular cross section about a first rotation axis and including a first mating end and a first outer end at opposite ends of the first portion;
    a second portion having a generally circular cross section about a second rotation axis and including a second mating end and second outer end at opposite ends of the second portion;
    each of the first and second outer ends including an annular protrusion;
    the first and second mating ends having substantially a same inside diameter and substantially a same outside diameter and including depressions evenly spaced therealong;
    wherein upon joining the first and second mating ends such that the first and second rotation axes align, and corresponding depressions in the first and second mating ends align, the aligned depressions define openings each adapted to receive an electron source.

2. The rotatable structure of claim 1, wherein the first and second mating ends respectively include first and second mating faces between the evenly spaced depressions;
    the first portion including a plurality of well regions located on an inner surface thereof and aligned with corresponding ones of the first mating faces, ones of the first mating faces including a first hole communicating between the well region and its corresponding first mating face, each of the first holes for receiving a fastener;
    the second portion including a second hole in each of ones of the second mating faces corresponding to the ones of the first mating faces having therethrough one of the first holes, each of the second holes for receiving the fastener for engagement therewith;
    wherein upon joining the first and second mating faces such that the first and second rotation axes align and the first and second holes align, the fastener inserted via one of the wells through the corresponding first hole passes into the second hole in the corresponding second mating face for engagement with the second hole.

3. The rotatable structure of claim 1, wherein the first and second portions are formed of stainless steel.

4. A rotatable structure for use in an electron beam system, comprising:
    a generally barrel shaped central portion having a generally annular cross section concentric about a rotation axis, an outer surface of the central portion having a first curvature in a plane perpendicular to the rotation axis, a center of curvature of the first curvature being on the rotation axis, a diameter of the outer surface being greatest at a midpoint along a direction generally parallel to the rotation axis and decreasing toward opposite ends of the central portion, a second curvature of the outer surface along a direction generally parallel to the rotation axis having a center of curvature displaced from the rotation axis; and a plurality of openings annularly disposed in the central portion along a circumference at the midpoint of the central portion, each of the openings being adapted to receive an electron source.

5. The rotatable structure of claim 4, further including first and second end portions respectively on opposite ends of the central portion, each of the first and second end portions having a generally circular cross section and including a protrusion having an outside diameter greater than a diameter of the central portion at a plane where the first or second end portion meets the central portion.

6. The rotatable structure of claim 5, wherein the first and second end portions are generally annular;
the rotatable structure further including a disk shaped wall generally perpendicular to the rotation axis and within the central portion closer to one of the first and second end portions.

7. The rotatable structure of claim 6, wherein the disk shaped wall includes an opening at a central portion thereof for coupling to a structure for rotating the rotatable structure.

8. The rotatable structure of claim 4, wherein the center of curvature of the second curvature is displaced from the rotation axis such that a radius of curvature of the second curvature is greater than a distance from a point on the rotation axis midway along the central portion to the midpoint on the outer surface.

9. The rotatable structure of claim 4, wherein the central portion is formed of stainless steel.

10. The rotatable structure of claim 4, wherein the outer surface of the central portion is electropolished.

11. A rotatable structure for use in an electron beam system, comprising:
a generally barrel shaped central portion having a generally annular cross section concentric about a rotation axis; and
first and second end portions respectively on opposite ends of the central portion, each of the first and second end portions having a generally annular cross section concentric with the central portion and including a protrusion having an outside diameter greater than a diameter of the central portion at a plane where the first or second end portion meets the central portion;
wherein the central portion includes a plurality of openings annularly disposed along a circumference at a midpoint of the central portion, each of the openings being adapted to receive an electron source.

12. The rotatable structure of claim 11, the rotatable structure further including a disk shaped wall generally perpendicular to the rotation axis and within the central portion closer to one of the first and second end portions.

13. The rotatable structure of claim 12, wherein the disk shaped wall includes an opening at a central portion thereof for coupling to a structure for rotating the rotatable structure.

14. The rotatable structure of claim 11, wherein the central portion and first and second end portions are formed of stainless steel.

15. The rotatable structure of claim 11, wherein an outer surface of the central portion is electropolished.

16. An electron beam system, comprising:
an electron gun for generating an electron beam;
beam optics to receive the generated electron beam and to perform beam shaping and steering functions; and
a controller coupled at least to the beam optics to control the beam shaping and steering functions;
wherein the electron gun comprises a rotatable structure including
a generally barrel shaped central portion having a generally annular cross section concentric about a rotation axis, an outer surface of the central portion having a first curvature in a plane perpendicular to the rotation axis, a center of curvature of the first curvature being on the rotation axis, a diameter of the outer surface being greatest at a midpoint along a direction generally parallel to the rotation axis and decreasing toward opposite ends of the central portion, a second curvature of the outer surface along the direction generally parallel to the rotation axis having a center of curvature displaced from the rotation axis, and
a plurality of openings annularly disposed in the central portion along a circumference at the midpoint of the central portion, each of the openings being adapted to receive an electron source.

17. The electron beam system of claim 16, the rotatable structure further including an electron source respectively mounted in ones of the plurality of openings.

18. The electron beam system of claim 16, the rotatable structure further including:
first and second end portions respectively on opposite ends of the central portion, each of the first and second end portions being generally annular and including a protrusion having an outside diameter greater than a diameter of the central portion at a plane where the first or second end portion meets the central portion;
a disk shaped wall generally perpendicular to the rotation axis and within the central portion closer to the first end portion; and
an electrical insulator having a first end introduced into the first end portion and coupled to the disk shaped wall;
the electron gun further including
a vacuum vessel within which the rotatable structure is located, and
a drive shaft having a first end coupled to a second end of the electrical insulator, a second end of the drive shaft being couplable through a wall of the vacuum vessel to be driven to rotate the rotatable structure.

19. The electron beam system of claim 18, wherein the protrusion of the first end portion is configured to shield the electrical insulator from reflected electrons during operation of the electron gun.

20. The electron beam system of claim 18, the rotatable structure further including electron sources respectively mounted in ones of the plurality of openings;
wherein the drive shaft is drivable to rotate the rotatable structure to move an active one of the electron sources into a position to generate the electron beam.

21. The electron beam system of claim 16, the rotatable structure further including:
first and second end portions respectively on opposite ends of the central portion, each of the first and second end portions having a generally circular cross section and including a protrusion having an outside diameter greater than a diameter of the central portion at a plane where the first or second end portion meets the central portion; and electron sources respectively mounted in ones of the plurality of openings;

the electron gun further including
- a vacuum vessel within which the rotatable structure is located, and
- a high voltage feedthrough introduced into the first end portion and including an electrical contact for making contact with an active one of the electron sources to apply a high voltage thereto.

22. The electron beam system of claim 16, the rotatable structure further including:
- electron sources respectively mounted in ones of the plurality of openings;
- a disk shaped wall generally perpendicular to the rotation axis and within the central portion closer to the first end portion; and
- an electrical insulator having a first end introduced into the first end portion and coupled to the disk shaped wall;

the electron gun further including
- a vacuum vessel within which the rotatable structure is located,
- a drive shaft having a first end coupled to a second end of the electrical insulator, a second end of the drive shaft being couplable through a wall of the vacuum vessel to be driven to rotate the rotatable structure, and
- an anode structure within the vacuum vessel and positioned to receive an electron beam generated by an active one of the electron sources;
- wherein the drive shaft is drivable to rotate the rotatable structure to bring the active electron source into alignment with the anode structure.

23. An electron beam system, comprising:
- an electron gun for generating an electron beam;
- beam optics to receive the generated electron beam and to perform beam shaping and steering functions; and
- a controller coupled at least to the beam optics to control the beam shaping and steering functions;
- wherein the electron gun comprises a rotatable structure including
  - a generally barrel shaped central portion having a generally annular cross section concentric about a rotation axis, and
  - first and second end portions respectively on opposite ends of the central portion, each of the first and second end portions having a generally annular cross section concentric with the central portion and including a protrusion having an outside diameter greater than a diameter of the central portion at a plane where the first or second end portion meets the central portion,
- wherein the central portion includes a plurality of openings annularly disposed along a circumference at a midpoint of the central portion, each of the openings being adapted to receive an electron source.

24. The electron beam system of claim 23, the rotatable structure further including electron sources respectively mounted in ones of the plurality of openings.

25. The electron beam system of claim 23, the rotatable structure further including:
- a disk shaped wall generally perpendicular to the rotation axis and within the central portion closer to the first end portion; and
- an electrical insulator having a first end introduced into the first end portion and coupled to the disk shaped wall;

the electron gun further including
- a vacuum vessel within which the rotatable structure is located, and
- a drive shaft having a first end coupled to a second end of the electrical insulator, a second end of the drive shaft being couplable through a wall of the vacuum vessel to be driven to rotate the rotatable structure.

26. The electron beam system of claim 25, wherein the protrusion of the first end portion is configured to shield the electrical insulator from reflected electrons during operation of the electron source.

27. The electron beam system of claim 25, the rotatable structure further including electron sources respectively mounted in ones of the plurality of openings;
- wherein the drive shaft is drivable to rotate the rotatable structure to move an active one of the electron sources into a position to generate an electron beam.

28. The electron beam system of claim 23, the rotatable structure further including:
- electron sources respectively mounted in ones of the plurality of openings;

the electron gun further including
- a vacuum vessel within which the rotatable structure is located, and
- a high voltage feedthrough introduced into the first end portion and including an electrical contact for making contact with an active one of the electron sources to apply a high voltage thereto.

29. The electron beam system of claim 23, the rotatable structure including:
- electron sources respectively mounted in ones of the plurality of openings;
- a disk shaped wall generally perpendicular to the rotation axis and within the central portion closer to the first end portion; and
- an electrical insulator having a first end introduced into the first end portion and coupled to the disk shaped wall;

the electron gun further including
- a vacuum vessel within which the rotatable structure is located,
- a drive shaft having a first end coupled to a second end of the electrical insulator, a second end of the drive shaft being couplable through a wall of the vacuum vessel to be driven to rotate the rotatable structure, and
- an anode structure within the vacuum vessel and positioned to receive an electron beam generated by an active one of the electron sources,
- wherein the drive shaft is drivable to rotate the rotatable structure to bring the active electron source into alignment with the anode structure.

* * * * *